(12) United States Patent
Hwang et al.

(10) Patent No.: US 11,309,206 B2
(45) Date of Patent: Apr. 19, 2022

(54) ELECTRO STATIC CHUCK

(71) Applicant: MiCo Ceramics Ltd., Anseong (KR)

(72) Inventors: Jeonghun Hwang, Osan (KR);
Hankyun Yoo, Anseong (KR);
Sangbum Cho, Anseong (KR)

(73) Assignee: MiCo Ceramics Ltd., Anseong (KR)

(*) Notice: Subject to any disclaimer, the term of this patent is extended or adjusted under 35 U.S.C. 154(b) by 0 days.

(21) Appl. No.: 16/746,572

(22) Filed: Jan. 17, 2020

(65) Prior Publication Data

US 2021/0210370 A1    Jul. 8, 2021

(30) Foreign Application Priority Data

Jan. 8, 2020 (KR) .................. 10-2020-0002450

(51) Int. Cl.
*H01L 21/683* (2006.01)

(52) U.S. Cl.
CPC .................. *H01L 21/6833* (2013.01)

(58) Field of Classification Search
CPC .................................................. H01L 21/6833
See application file for complete search history.

(56) References Cited

U.S. PATENT DOCUMENTS

| | | | | |
|---|---|---|---|---|
| 5,822,172 A * | 10/1998 | White | ................. | H01L 21/6831 361/234 |
| 6,781,812 B2 * | 8/2004 | Fuwa | ..................... | C23C 14/50 361/234 |
| 7,283,346 B2 * | 10/2007 | Yoshida | ............. | H01L 21/6833 361/230 |
| 7,352,554 B2 * | 4/2008 | Lagos | ................. | H01L 21/6833 361/233 |
| 8,004,817 B2 * | 8/2011 | Peitzsch | ............. | H01L 21/6831 361/234 |
| 8,018,163 B2 * | 9/2011 | Wi | ..................... | H01J 37/32174 156/345.47 |
| 9,093,488 B2 * | 7/2015 | Anada | ................. | H01L 21/6833 |
| 9,281,227 B2 * | 3/2016 | Lee | ..................... | H01L 21/6833 |
| 9,518,326 B2 * | 12/2016 | Brown | ............... | H01L 21/6831 |
| 9,633,885 B2 * | 4/2017 | Lee | ..................... | H01L 21/6831 |
| 9,704,734 B2 * | 7/2017 | Thiel | ................... | H01L 21/6833 |
| 10,818,480 B2 * | 10/2020 | Mitsumori | ........ | H01J 37/32724 |
| 10,825,660 B2 * | 11/2020 | Yamaguchi | ....... | H01J 37/32724 |
| 2004/0066601 A1 * | 4/2004 | Larsen | .................. | H02N 13/00 361/234 |
| 2007/0209933 A1 * | 9/2007 | Yoshioka | .......... | H01L 21/67109 204/298.31 |

(Continued)

FOREIGN PATENT DOCUMENTS

KR        20140069198 A       6/2014
KR        101896127 B1        9/2018

(Continued)

*Primary Examiner* — Eric A. Gates

(57) ABSTRACT

Disclosed is an electro static chuck. Disclosed is an electro static chuck which includes: a base substrate; and an electro static chuck plate fixed onto the base substrate and including a plurality of electrodes to which biases for chucking and dechucking are applied, in which the plurality of electrodes includes a spiral pattern extending from a start point of an edge of the electro static chuck plate toward an end point of a center and a rotational angle of the spiral pattern is $360°n$ (n is a real number of 1 to 2).

12 Claims, 9 Drawing Sheets

(56) References Cited

U.S. PATENT DOCUMENTS

| | | | | |
|---|---|---|---|---|
| 2008/0062609 A1* | 3/2008 | Himori | ............... | H01L 21/6833 |
| | | | | 361/234 |
| 2018/0061615 A1* | 3/2018 | Kim | ................... | H01L 21/6838 |
| 2020/0312684 A1* | 10/2020 | Mine | ................ | H01L 21/68742 |

FOREIGN PATENT DOCUMENTS

| | | |
|---|---|---|
| WO | WO2012033922 A2 | 3/2012 |
| WO | WO2013049586 A1 | 4/2013 |

* cited by examiner

ELECTRO STATIC CHUCK

CROSS-REFERENCE TO RELATED APPLICATIONS

This application claims priority to Korean Patent Application No. 10-2020-0002450 filed on Jan. 8, 2020 in Korean Intellectual Property Office, the entire contents of which is hereby incorporated by reference in its entirety.

TECHNICAL FIELD

The present invention relates to an electro static chuck, and particularly, to an electro static chuck having optimum electro static and discharge performance through an enhanced electro static electrode structure.

BACKGROUND ART

A semiconductor device or a display device is fabricated by laminating and patterning multiple thin film layers including a dielectric layer and a metal layer on a glass substrate, a flexible substrate, or a semiconductor wafer substrate through semiconductor processes including a chemical vapor deposition (CVD) process, a physical vapor deposition (PVD) process, an ion implantation process, an etch process, and the like. A chamber apparatus for performing the semiconductor processes includes an electro static chuck (ESC) for supporting various substrates such as the glass substrate, the flexible substrate, and the semiconductor wafer substrate and fixing the corresponding substrate, in particular, using electro static force.

The electro static chuck is required to rapidly chuck and dechuck the substrate simultaneously with providing sufficient clamping force in order to firmly adsorb the substrate in the ion implantation process or other semiconductor process apparatuses. To this end, an electro static chuck is used, which is driven by alternating current (AC) voltage capable of enhancing chucking and dechucking times of the substrate while maintaining clamping pressure.

A substrate such as a semiconductor wafer is adsorbed and then the process is in progress while the substrate is erected at a specific implantation angle or an AC electro static chuck should maintain strong electro static force and uniform electro static force so as to prevent the substrate from falling when moving during a process such as scanning the electro static chuck (ESC) in X and Y-axis directions at a high speed. There is a case where a conventional electrode pattern is intended to be changed in order to solve such a problem, but the same problem still occurs.

As a related literature, Korean Patent Application No. 10-2014-7010453 discloses a symmetric electrode structure, but has a problem in that a gap between electrodes is short, and as a result, the chucking force is weak and Korean Patent Registration No. 10-1896127 discloses a structure for increasing a length of the gap between the electrodes, but has a problem in that since the structure is not a structure in which an electrode area is uniform over the entire region, uniform chucking and dechucking are not achieved.

SUMMARY OF THE INVENTION

Accordingly, the present invention is contrived to solve the problem and the present invention has been made in an effort to provide an arrangement of electrodes for uniform chucking and dechucking in an AC electro static chuck driven by AC voltage.

An exemplary embodiment of the present invention provides an electro static chuck which includes: a base substrate; and an electro static chuck plate fixed onto the base substrate and including a plurality of electrodes to which biases for chucking and dechucking are applied, in which the plurality of electrodes includes a spiral pattern extending from a start point of an edge of the electro static chuck plate toward an end point of a center and a rotational angle of the spiral pattern is 360°n (n is a real number of 1 to 2).

The plurality of electrodes may be rotationally symmetric.

The plurality of electrodes may include a plurality of first electrodes having a first polarity and a plurality of second electrodes having a second polarity, and the first electrode and the second electrode may be radially alternated.

The total numbers of the plurality of first electrodes and the plurality of second electrodes may be even.

Areas of each of the plurality of first electrodes and the plurality of second electrodes may be the same.

Each of the plurality of first electrodes and the plurality of second electrodes may have one or more bent parts between the start point and the end point of the electro static chuck plate.

Each of the plurality of first electrodes and the plurality of second electrodes may have a fluctuated contour between the start point and the end point of the electro static chuck plate.

The plurality of first electrodes or the plurality of second electrodes may have one or more holes for a cooling gas hole between the start point and the end point of the electro static chuck plate.

The plurality of first electrodes or the plurality of second electrodes may have a width narrowed part for the cooling gas hole between the start point and the end point of the electro static chuck plate.

In addition, the plurality of electrodes may include a plurality of electrode patterns and include a plurality of electrode gaps among the plurality of electrode patterns, and a length of a center line of the electrode gap may be 1.1 to 5 times the length of the center line of the electrode pattern.

Each of the plurality of electrodes may include four quadrants divided by two orthogonal line segments passing through the center and one of the two orthogonal line segments may be an extension line formed by extending a tangent when the tangent of the center line at the end point of the corresponding electrode meets an outer periphery of the electro static chuck plate, and an area ratio deviation or standard deviation of four quadrants may be equal to or less than 0.2.

Each of the plurality of electrodes may include two parts divided by the extension line formed by extending a tangent when the tangent of the center line at the end point meets the outer periphery of the electro static chuck plate and an area ratio difference of the two parts may be equal to or less than 10%.

Another exemplary embodiment of the present invention provides an electro static chuck which includes: a base substrate and an electro static chuck plate fixed onto the base substrate and including a plurality of electrodes to which biases for chucking and dechucking are applied, in which each of the plurality of electrodes includes a spiral pattern extending toward an end point of a center from a start point of an edge of the electro static chuck plate and has two or more cross points passing through an extension line formed by extending a tangent when the tangent of a center line at the end point meets an outer periphery of the electro static chuck plate.

Each of the plurality of electrodes may have two or more cross points passing through an extension line of a line segment orthogonal to the extension line.

Still another exemplary embodiment of the present invention provides an electro static chuck which includes: an insulating layer; an electrode layer on the insulating layer; and a dielectric layer on the electrode layer, in which the electrode layer includes a plurality of electrodes for receiving biases for chucking and dechucking, and the plurality of electrodes includes a spiral pattern extending from a start point of an edge of the electro static chuck plate toward an end point of a center and a rotational angle of the spiral pattern is 360°n (n is a real number of 1 to 2).

According to an exemplary embodiment of the present invention, in an electro static chuck, smooth chucking and dechucking can be achieved through an electrode structure in which a shape of an electrode and a form of an inter-electrode gap have optimum electro static and discharge performance for uniform chucking and dechucking regions.

The electro static chuck according to the present invention can provide stable dechucking in which chucking force of electro static adsorption is strengthened and a discharge time of an electric charge after a process is shortened by a multi-zone electrode structure (e.g., 6 zones) in which an area of an electrode is uniformly distributed over the entire region by minimizing the area of electrodes and maximally increasing a gap between the electrodes (360°n, e.g., an angle of a spiral electrode pattern of 360 to 760).

BRIEF DESCRIPTION OF THE DRAWINGS

In order to help understand the present invention, the accompanying drawings which are included as a part of the Detailed Description provide embodiments of the present invention and describe the technical spirit of the present invention together with the Detailed Description.

DETAILED DESCRIPTION

Figure 1:
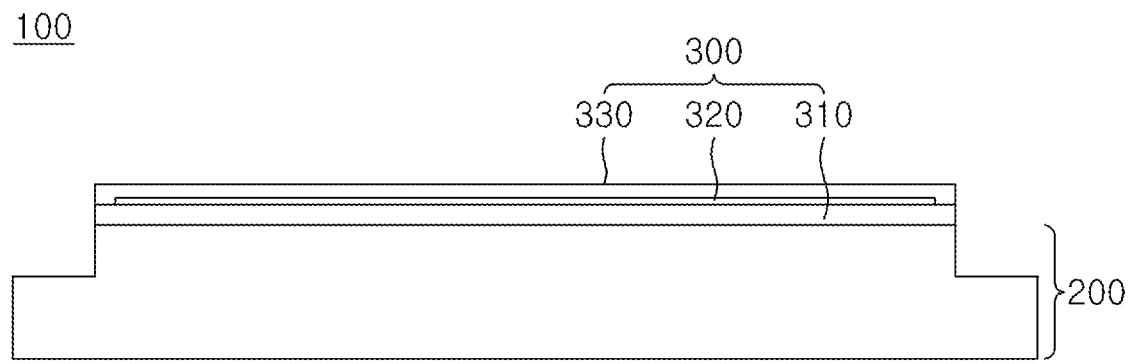
FIG. 1 is a diagram for describing a structure of an electro static chuck according to an exemplary embodiment of the present invention.

Hereinafter, the present invention will be described in detail with reference to the accompanying drawings. In this case, the same components in each drawing are represented by the same reference numerals as much as possible. In addition, detailed descriptions of already known functions and/or configurations are omitted. The following description focuses on parts necessary for understanding the operation according to various embodiments, and descriptions of elements that may obscure the gist of the description are omitted. In addition, some components of the drawings may be exaggerated, omitted, or schematically illustrated. The size of each component does not entirely reflect the actual size, and thus the contents described herein are not limited by the relative size or spacing of the components drawn in the respective drawings.

In describing the exemplary embodiments of the present invention, a detailed description of known art related with the present invention will be omitted when it is judged that the detailed description may unnecessarily make the gist of the present invention unclear. In addition, terms to be described below as terms which are defined in consideration of functions in the present invention may vary depending on the intention of a user or an operator or usual practice. Accordingly, the terms need to be defined based on contents throughout this specification. Terms used in a detailed description are to just describe the exemplary embodiments of the present invention and should not be restrictive in any way. Unless specifically used otherwise, expression of a singular form includes a meaning of a plural form. In the present description, an expression such as "including" or "comprising" is intended to indicate certain features, numbers, steps, operations, elements, some or combinations thereof and should not be construed to preclude the presence or possibility of one or more other features, numbers, steps, operations, elements, some or combinations thereof in addition to the described things.

Terms including as first, second, and the like are used for describing various constituent elements, but the constituent elements are not limited by the terms and the terms are used only for distinguishing one constituent element from other constituent elements.

FIG. 1 is a diagram for describing a structure of an electro static chuck 100 according to an exemplary embodiment of the present invention.

Referring to FIG. 1, an electro static chuck 100 according to an exemplary embodiment of the present invention includes a base substrate 200 and an electro static chuck plate 300. The electro static chuck 100 is preferably a circular type, but in some cases, the electro static chuck 100 may be designed in other shapes including oval, square, and the like.

The base substrate 200 may be formed by a multi-layer structure constituted by a plurality of metal layers. The metal layers may be bonded through a brazing process, a welding process, or a bonding process. The electro static plate 300 may be fixed onto the base substrate 200. The electro static plate 300 may be fixed on the base substrate 200 using a predetermined fixation means or bonding means. The base substrate 200 and the electro static chuck plate 300 may be separately fabricated and bonded and in some cases, a structure of the electro static chuck plate 300 may be directly formed on the top of the base substrate 200.

When the electro static chuck 100 is mounted in a chamber, the base substrate 200 and the electro static chuck plate 300 may include a predetermined cooling structure (not illustrated) in order to uniformly cool a substrate (e.g., a glass substrate, a flexible substrate, and a semiconductor wafer substrate) on the electro static chuck plate 300 using external cooling gas. For example, the cooling gas flows through cooling gas holes and cooling path patterns of the base substrate 200 and the electro static chuck plate 300 to uniformly cool the substrate on the electro static chuck plate 300. In this case, as the cooling gas, helium gas (He) may be primarily used and the cooling gas is not particularly limited thereto.

In FIG. 1, the electro static plate 300 includes an insulating layer 310, an electrode layer 320 on the insulating layer 310, and a dielectric layer 330 on the electrode layer.

The insulating layer 310 may be made of a ceramic material. As an exemplary embodiment, the insulating layer 310 may be formed by aluminum oxide ($Al_2O_3$). Meanwhile, as another exemplary embodiment, the insulating layer 310 may be formed at least one of aluminum nitride (AlN), silicon carbide (SiC), and silicon nitride ($Si_3N_4$) in addition to aluminum oxide ($Al_2O_3$). The insulating layer 310 may be formed by performing a thermal spray coating process on the top of the base substrate 200. The insulating layer 310 formed as above serves to insulate the base substrate 200 and the electrode layer 320 from each other.

The electrode layer 320 may be made of a conductive metallic material. As an example, the electrode layer 320 may be formed by at least one of silver (Ag), gold (Au), nickel (Ni), tungsten (W), molybdenum (Mo), and titanium (Ti) and more preferably formed by tungsten (W). The electrode layer 320 may be formed using the thermal spray coating process or a screen print process. The electrode layer 320 has a thickness of approximately 30 to 50 μm. For example, when the thickness of the electrode layer 320 is less than 30 μm, a phenomenon undesirably occurs in which a resistance value increases due to a porosity and other defects in the corresponding electrode layer and electro static adsorption force decreases with an increase in resistance value. Further, when the thickness of the electrode layer 320 is more than 50 μm, an arcing phenomenon may undesirably occur due to occurrence of overcurrent. Accordingly, the thickness of the electrode layer 320 is preferably in the range of approximately 30 to 50 μm. The electrode layer 320 may be formed, in particular, in a special spiral pattern in the present invention as described in FIG. 2 or below. The electrode layer 320 formed as above may generate the electro static force for chucking by receiving a bias when loading a substrate (not illustrated) placed on the top of the dielectric layer 330. When the substrate (not illustrated) is unloaded, discharge is made by applying an opposite bias to the electrode layer 320, and as a result, dechucking is made.

The dielectric layer 330 may be made of the ceramic material. As an exemplary embodiment, the dielectric layer 330 may be formed by aluminum oxide ($Al_2O_3$) which is the same material as the insulating layer 310. Meanwhile, as another exemplary embodiment, the dielectric layer 330 may be formed at least one of silicon oxide ($SiO_2$), barium oxide (BaO), zinc oxide (ZnO), cobalt oxide (CoO), tin oxide ($SnO_2$), and zirconium oxide ($ZrO_2$) in addition to aluminum oxide ($Al_2O_3$). The dielectric layer 330 may be formed by performing the thermal spray coating process on the tops of the electrode layer 320. The dielectric layer 330 formed as above may perform a function of a dielectric so as to form the electro static force by the electrode layer 320.

Figure 2:
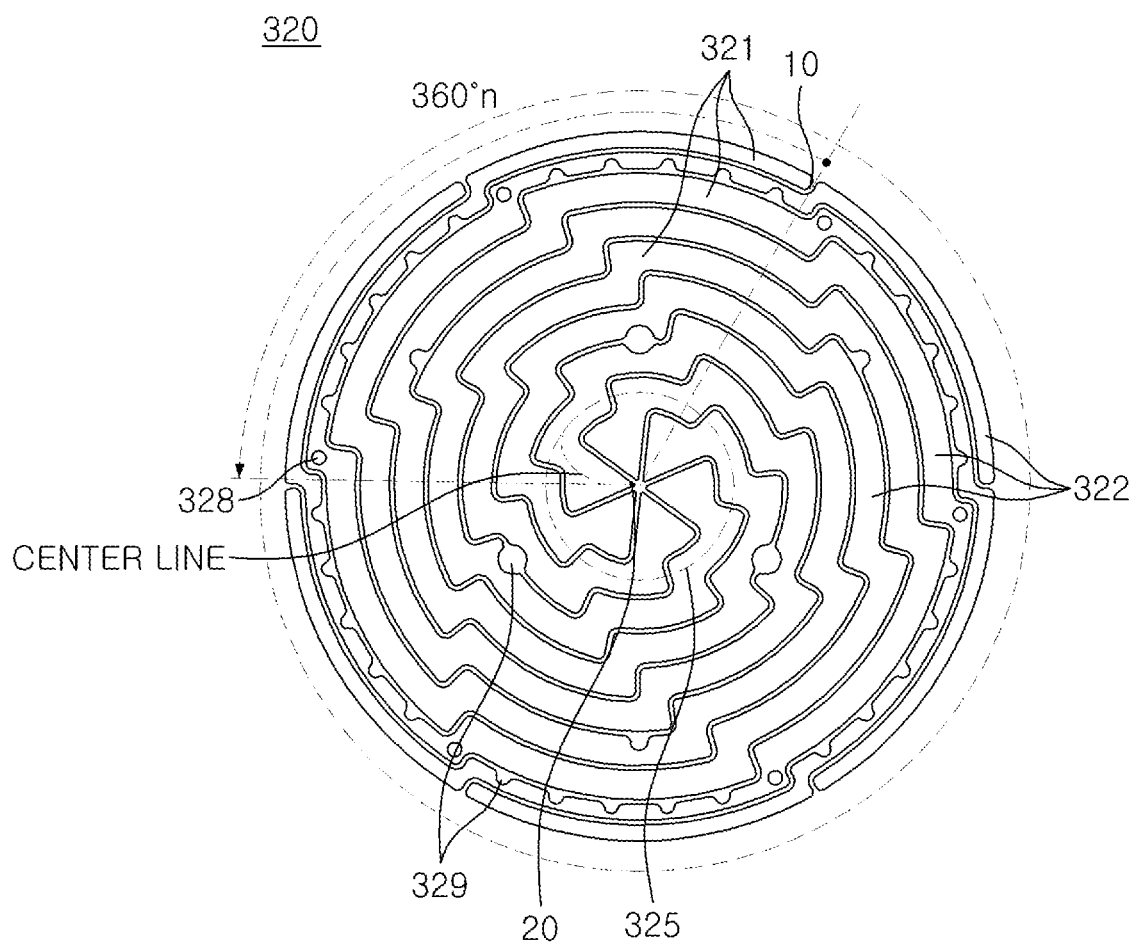
FIG. 2 is a diagram for describing an electrode layer structure of an electro static chuck plate according to an exemplary embodiment of the present invention.

FIG. 2 is a diagram for describing an electrode layer structure of an electro static chuck plate 300 according to an exemplary embodiment of the present invention. Referring to FIG. 2, an electro static chuck plate 300 according to an exemplary embodiment of the present invention includes a plurality of electrodes 321 and 322 for receiving bias voltage or current for chucking or dechucking.

As illustrated in FIG. 2, a plurality of first electrodes 321 and a plurality of second electrodes 322 are disposed radially alternately to each other so as to receive biases (when any one is positive, the other one is negative) having opposite polarities. Accordingly, the number acquired by totally adding the plurality of first electrodes 321 and the plurality of second electrodes 322 is preferably an even number for achieving uniform chucking and dechucking over the entire region. In FIG. 2, a 6-zone forming type having 6 electrodes is illustrated, which is acquired by totally adding a 3-zone occupied by three first electrodes 321 and a 3-zone occupied by three second electrodes 322.

Preferably, in the present invention, the plurality of electrodes 321 and 322 may have a rotational symmetry.

In the present invention, in the plurality of first electrodes 321 and the plurality of second electrodes 322, a rotational angle of a spiral pattern which extends from a start point 10 of an edge of the electro static chuck plate 300 toward an end point 20 of a center line of an electrode at a center side is formed to be 360°*n (n is a real number of 1 to 2). In the specification of the present invention, the rotational angle of the spiral pattern refers to a maximum value among angles between a reference point and a center line trajectory of the spiral pattern from the end point 20 of the spiral pattern to the start point 10 of the spiral pattern when a point where a tangent of the center line at the end point of the spiral pattern meets an outer periphery (outer diameter) of the electro static chuck plate is referred to as the reference point. In this case, the center line of the spiral pattern means a line connecting points at an intermediate location in a width direction in the spiral pattern extending in a longitudinal direction with a constant width and for example, when a circle having a predetermined radius is drawn based on an origin of the electro static chuck plate, midpoints of a straight line connecting two points where the circle having the radius meets a contour of the spiral pattern are connected to obtain the center line.

Preferably, in all of the plurality of first electrodes 321 and the plurality of second electrodes 322, the rotational angle of the spiral pattern is 360° or higher and a forming angle of a continuously extending plane of the spiral pattern may be designed up to twice 360° according to a size of the electro static chuck plate 300.

The present invention is useful in particular when being applied to the AC electro static chuck. Since the rotational angle of the spiral pattern of each of the electrodes 321 and 322 is designed to be 360° or higher, and as a result, three pairs of first electrode and second electrode patterns meet in all radial directions from the center of the electro static chuck plate, uniform electro static force may be provided regardless of a phase of voltage even when AC voltages having different predetermined phases are applied to each pair of electrodes.

When the bias for chucking and dechucking is applied to each of the electrodes 321 and 322, electro static force for chucking and discharge for dechucking may be uniformly made over the entire region of the electro static chuck plate 300. As a result, loading and unloading of the substrate such as the wafer are smoothly made on the electro static chuck plate 300 and a deviation or non-uniformity of an electrical characteristic and performance of a device fabricated after the process are suppressed, thereby acquiring an effect that a yield is enhanced.

For example, in the case of an electro static chuck for a 12-inch semiconductor wafer, in the plurality of first electrodes 321 and the plurality of second electrodes 322, an electrode angle of the spiral pattern is appropriately formed in the range of 360 to 720°.

The electro static chuck 100 of the present invention may be used for chucking and dechucking various substrates including the semiconductor wafer substrate, the glass substrate, the flexible substrate, and the like in a chamber for various processes such as a chemical vapor deposition (CVD) process or a physical vapor deposition (PVD). In particular, the electro static chuck 100 may be used for the ion implantation process and in this case, the electro static chuck 100 electro statically adsorbing the substrate is disposed to be inclined at 45 to 90° and the ion implantation process may be performed through a vertical or horizontal translation movement in the chamber. In this case, when sufficient electro static force is not secured, the substrate may be separated and in order to prevent the separation, the substrates are disposed around spirally so that the electrode pattern of the electro static chuck 100 has a rotational angle of 360° or higher, thereby effectively maintaining the substrates without a fear of separating the substrate at the time of chucking by the electro static force of the substrate. To this end, in the plurality of first electrodes 321 and the plurality of second electrodes 322, an optimum angle of the rotational angle of the spiral pattern may be converged on the center at approximately 470° as illustrated in FIG. 2.

The electrode structure of the electro static plate 300 according to the present invention may implement a multi-electrode structure while maintaining uniformity of the electrode area. In the exemplary embodiment of the present invention, the electro static force for chucking and the discharge for dechucking are uniformly made over the entire region in the multi-zone electrode structure (e.g., 6 zone) of 6 zones to provide strong chucking at the time of chucking and the process may be smoothly performed by stable dehucking in which the discharge time of the electric charge after the process is shortened.

As illustrated in FIG. 2, the spiral patterns of the plurality of first electrodes 321 and the plurality of second electrodes 322 extend continuously to the end point 20 of the center starting from the start point 10 of each of parts divided and occupied at the same interval along the edge of the electro static chuck plate 300. As a result, the spiral patterns of the plurality of first electrodes 321 and the plurality of second electrodes 322 have parts divided and occupied at the same interval radially around the center. In other words, the spiral patterns of the plurality of first electrodes 321 and the plurality of second electrodes 322 have parts divided and occupied at the same angle interval at the edge and the center. The spiral patterns of the plurality of first electrodes 321 and the plurality of second electrodes 322 may be formed to have the same area. Therefore, the electro static force for chucking and the discharge for dechucking are uniformly made over the entire region to provide strong chucking and stable and smooth dechucking.

The spiral patterns of the plurality of first electrodes 321 and the plurality of second electrodes 322 may include one or more holes (e.g., reference numeral 328 of FIG. 2) for a cooling gas hole which is in communication with the base substrate 200 between the start point 10 and the end point 20 of the electro static chuck plate 300. In other words, a perforation having a smaller diameter than a hole (e.g., reference numeral 328 of FIG. 2) without an electrode material is made in a hole to be in communication with the cooling gas hole or cooling path pattern of the base substrate 200. Besides, the spiral patterns of the plurality of first electrodes 321 and the plurality of second electrodes 322 may include a width narrowed part (e.g., reference numeral 329 of FIG. 2) for the cooling gas hole between the start point 10 and the end point 20 of the electro static chuck plate 300. Therefore, a perforation having a smaller diameter than the corresponding part (e.g., reference numeral 329 of FIG. 2) is made in the corresponding part to be in communication with the cooling gas hole or cooling path pattern of the base substrate 200.

Figure 3:
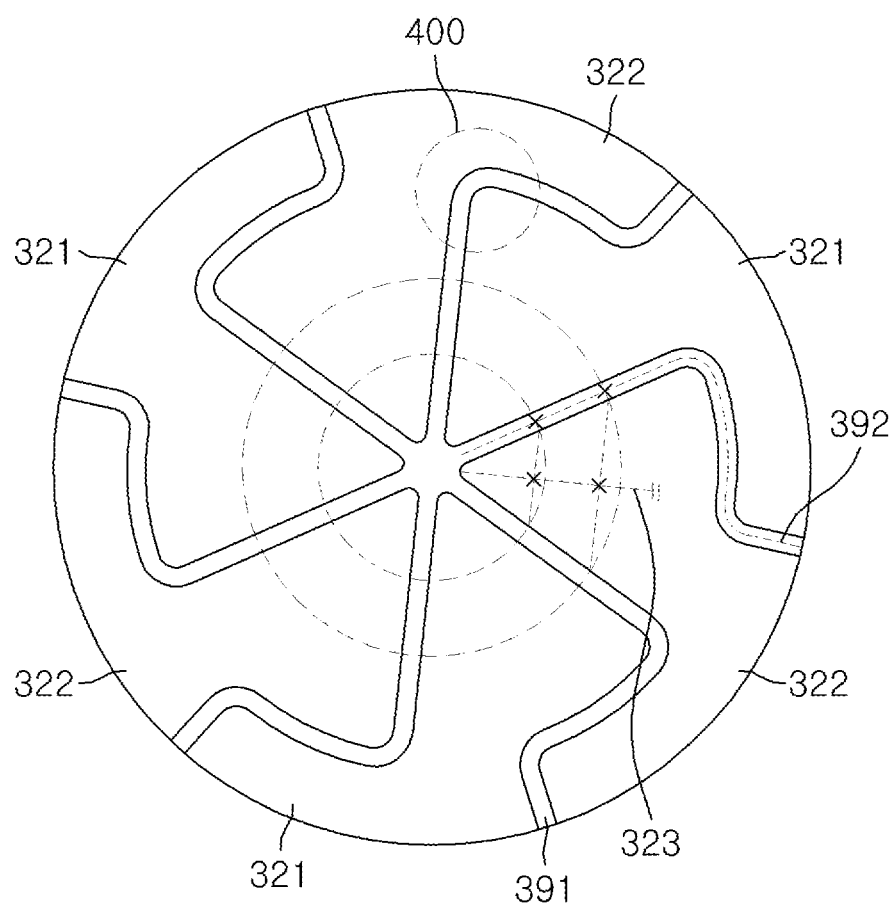
FIG. 3 is an enlarged diagram of an electrode pattern of a center part 325 of an electro static chuck plate according to an exemplary embodiment of the present invention.

FIG. 3 is an enlarged diagram of an electrode pattern of a center part 325 of an electro static chuck plate 300 of FIG. 2 according to an exemplary embodiment of the present invention.

As illustrated in FIG. 3, each of the spiral patterns of the plurality of first electrodes 321 and the plurality of second electrodes 322 may include one or more bent parts 400 between the start point 10 and the end point 20 of the electro static chuck plate 300.

Meanwhile, FIG. 3 schematically illustrates an example of acquiring a center line according to an exemplary embodiment of the present invention. Referring to FIG. 3, a circle having a predetermined radius is drawn around the center of the electro static chuck plate and points where the circle meets the electrode pattern are acquired. Next, a point (midpoint) bisecting a straight line extending the points may be acquired. The midpoints may be acquired by repeating the same task while differentiating the radius of the circle and a center line 323 may be acquired by connecting the midpoints. An electrode center line may be drawn in the electrode pattern by the above method and a gap center line 392 may be drawn in an electrode gap 391. In the exemplary embodiment, the electrode pattern and the gap have the rotational symmetry. As a result, the electrode center line 323 and a gap center line 392 have a shape close to a similar figure and lengths of the electrode center line and the gap center line are substantially equal to each other.

Figure 4:
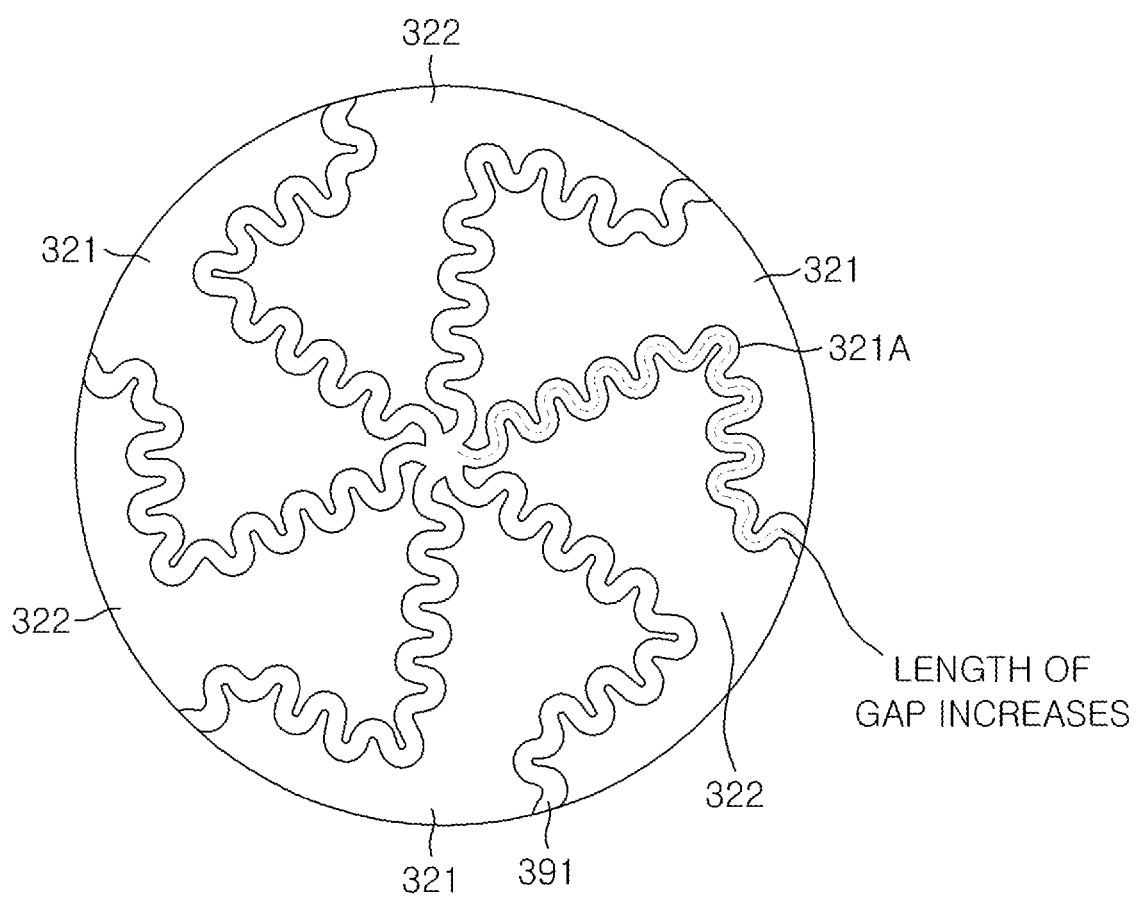
FIG. 4 is an enlarged diagram of a center part 325 in another example of an electrode pattern of an electro static chuck plate according to the present invention.

FIG. 4 is an enlarged diagram of a center part 325 of FIG. 2 in another example of an electrode pattern of an electro static chuck plate 300 according to the present invention.

As illustrated in FIG. 4, each of the spiral patterns of the plurality of first electrodes 321 and the plurality of second electrodes 322 has a fluctuated contour 321A at least at a part between the start point 10 and the end point 20 of the electro static chuck plate 300. The fluctuated contour may be provided over the entire region of the electrode, i.e., an entire path from the start point 10 to the end point 20, but in some cases, the fluctuated contour may be provided only in the partial path.

In the exemplary embodiment, in each of the spiral patterns of the plurality of first electrodes 321 and the plurality of second electrodes 322, from the start point 10 to the end point 20 of the electro static chuck 300, the length of the gap 391 between respective adjacent electrodes of the plurality of first electrodes 321 and the plurality of second electrodes 322 is even larger in FIG. 4 than the length in FIG. 3. In the case illustrated in FIG. 4, stronger electro static force may be generated than in FIG. 3 and the length of the gap between the respective electrodes adjacent through a bent part or a fluctuated part is preferably designed to have a length of the gap between the electrodes of approximately 850 mm or more (e.g., when used for the 12-inch semiconductor wafer) according to an optimum design. For example, the length of the gap between the electrodes may be designed as 500 to 5000 mm according to a design purpose. By more generalization, the length of the center line of the electrode gap may be preferably 1.1 times or more, 1.5 times or more, or 2.0 times or more larger than the lengths of the center lines of the plurality of electrodes 321 and 322 through the bent part or the fluctuated contour. Further, in the present invention, the length of the center line of the electrode gap may increase up to five times the lengths of the center lines of the plurality of electrodes.

Figure 5A:
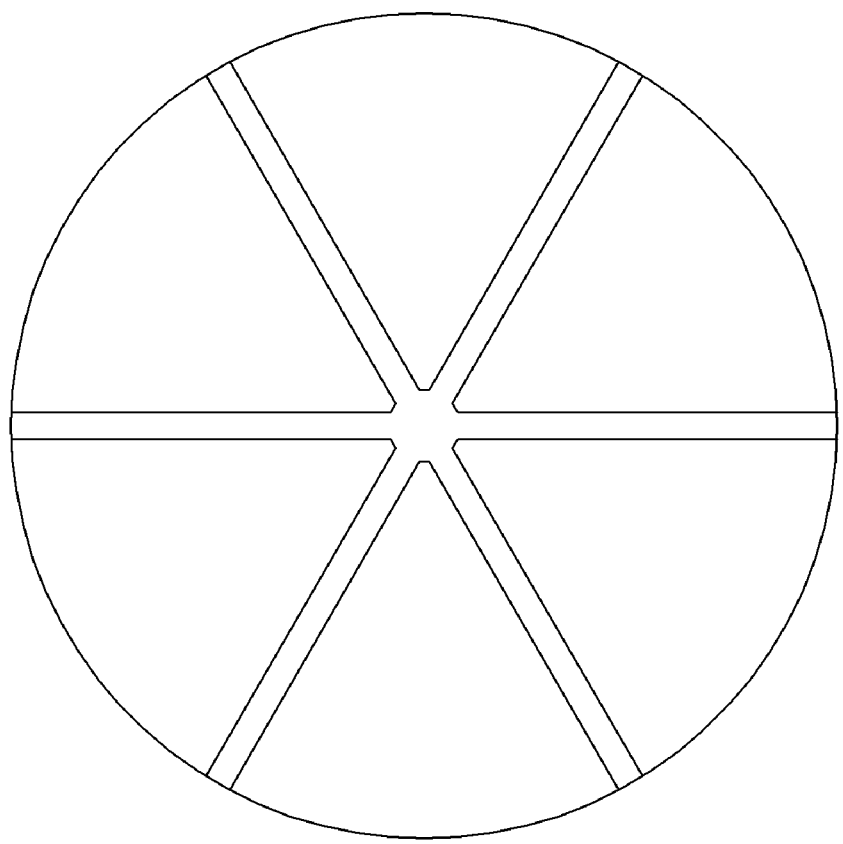
FIGS. 5A to 5C illustrate an example of an electrode layer structure of a conventional electro static chuck for comparison with an exemplary embodiment of the present invention.
Figure 5B:
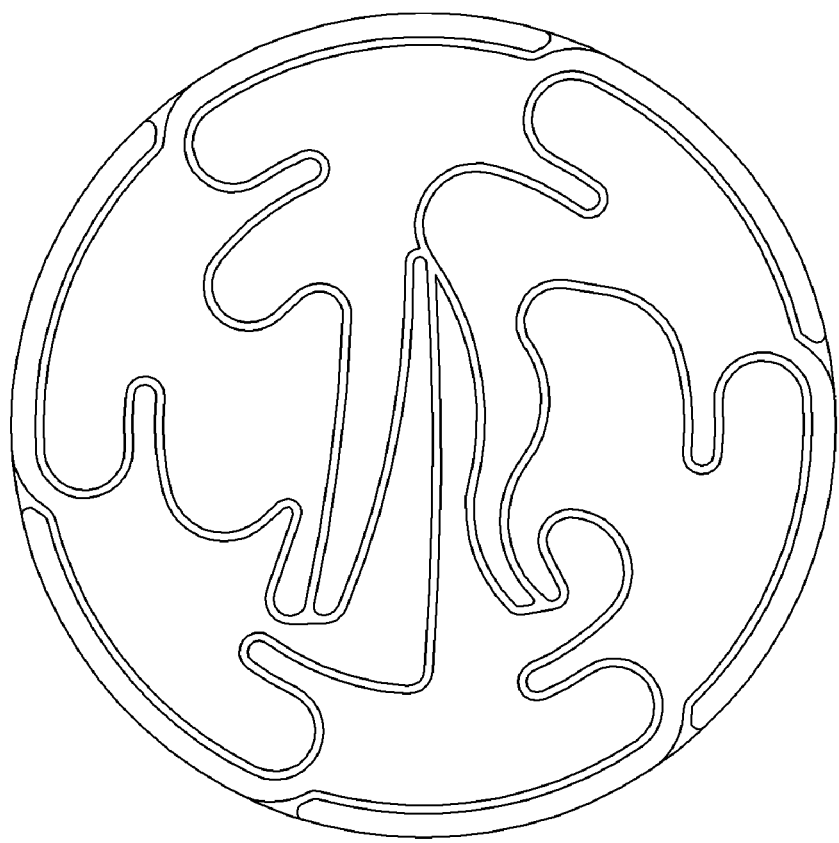
Figure 5C:
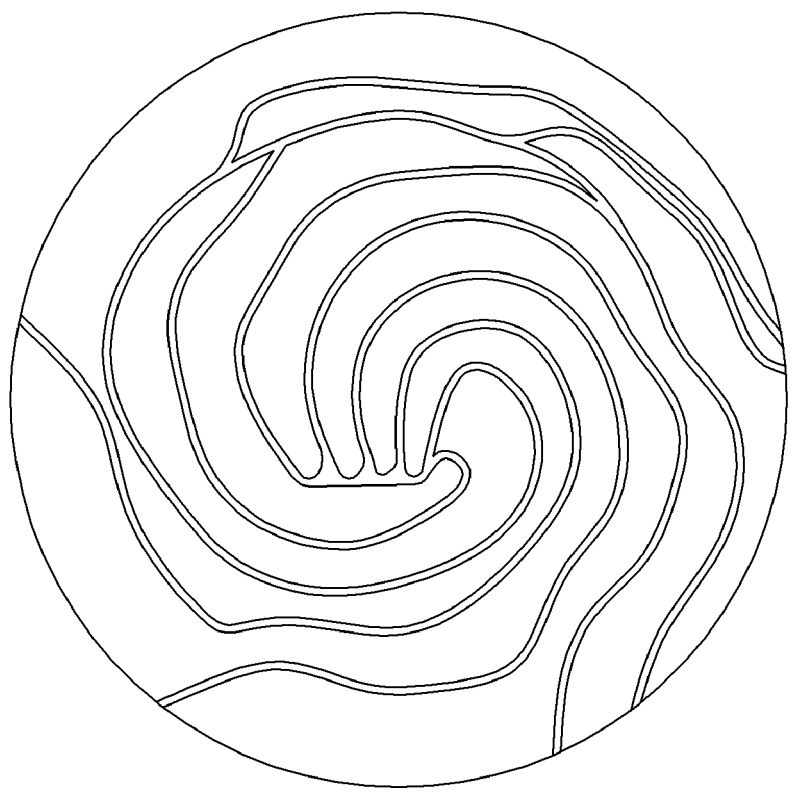

FIGS. 5A to 5C illustrate an example of an electrode layer structure of a conventional electro static chuck for comparison with the electro static chuck electrode layer 320 of the present invention. [Table1] below summarizes and shows features of conventional structures (FIGS. 5A, 5B, and 5C) of the electrode layer of the electro static chuck and the electro static chuck electrode layer 320 of the present invention.

TABLE 1

| Electro static chuck classification | Symmetry | Gap length | Electro static force of edge part |
|---|---|---|---|
| FIG. 5A | Symmetric | Short | None |
| FIG. 5B | Asymmetric | Short | Electro static force exists |
| FIG. 5C | Asymmetric | Long | Electro static force exists |
| Exemplary embodiment (FIG. 1) | Symmetric | Long | Electro static force exists |

In the conventional normal electrode layer structure illustrated in FIG. 5A, the length of the gap of symmetric electrodes is short and the electro static force is insufficient and only radial electrodes are configured at the edge part of the electro static chuck plate, and as a result, an operation angle of the electro static force is equivalent to 0. The electro static force is generated in a boundary part with an adjacent electrode and in the corresponding electro static chuck, since the length of the gap on a boundary between the adjacent electrodes is short and there is no separate pattern at an outer edge, the electro static force may be insufficient.

The conventional electrode layer structure illustrated in FIG. 5B includes asymmetric electrodes, but the length of the gap is comparatively short and a certain degree of electro static force is generated at the edge part of the electro static chuck plate and the operation angle of the electro static force by the asymmetric electrodes is configured at approximately 60°. Since an electrode shape is asymmetric, the electro static force and the dechucking may serve as an unstable element. In such a case, since the length of the gap between two electrodes forming the electro static force is comparatively short and has ⅙ interval (angle of 60°) of the entire arc length, the adsorption at only a part takes place when power source voltage is applied at a predetermined frequency as shown in [Table1], and as a result, the electro static force becomes insufficient.

The conventional electrode layer structure illustrated in FIG. 5C includes the asymmetric electrodes and the length of the gap is configured to be large to some degree and a certain degree of electro static force is generated at the edge part of the electro static chuck plate and the operation angle of the electro static force by the asymmetric electrodes is configured at approximately 180°. In the corresponding electro static chuck, the length of the gap between the adjacent electrodes is larger than the lengths in FIGS. 5A and 5B, but intervals of two electrodes forming the electro static force are within approximately 180°, and as a result, the electro static force may be insufficient.

On the contrary, in the electro static chuck electrode layer 320 of the present invention, the symmetric electrodes are configured so that the length of the gap is formed to be large and the electrode is configured so that the operation angle of the electro static force becomes 360°n (n is a real number of 1 to 2), i.e., approximately 470° so that the electro static force is generated sufficiently uniformly at the edge part of the electro static chuck plate 300.

Hereinafter, an additional feature of the electrode pattern of the electro static chuck plate 300 according to the present invention will be described in more detail with reference to FIG. 6.

Figure 6:
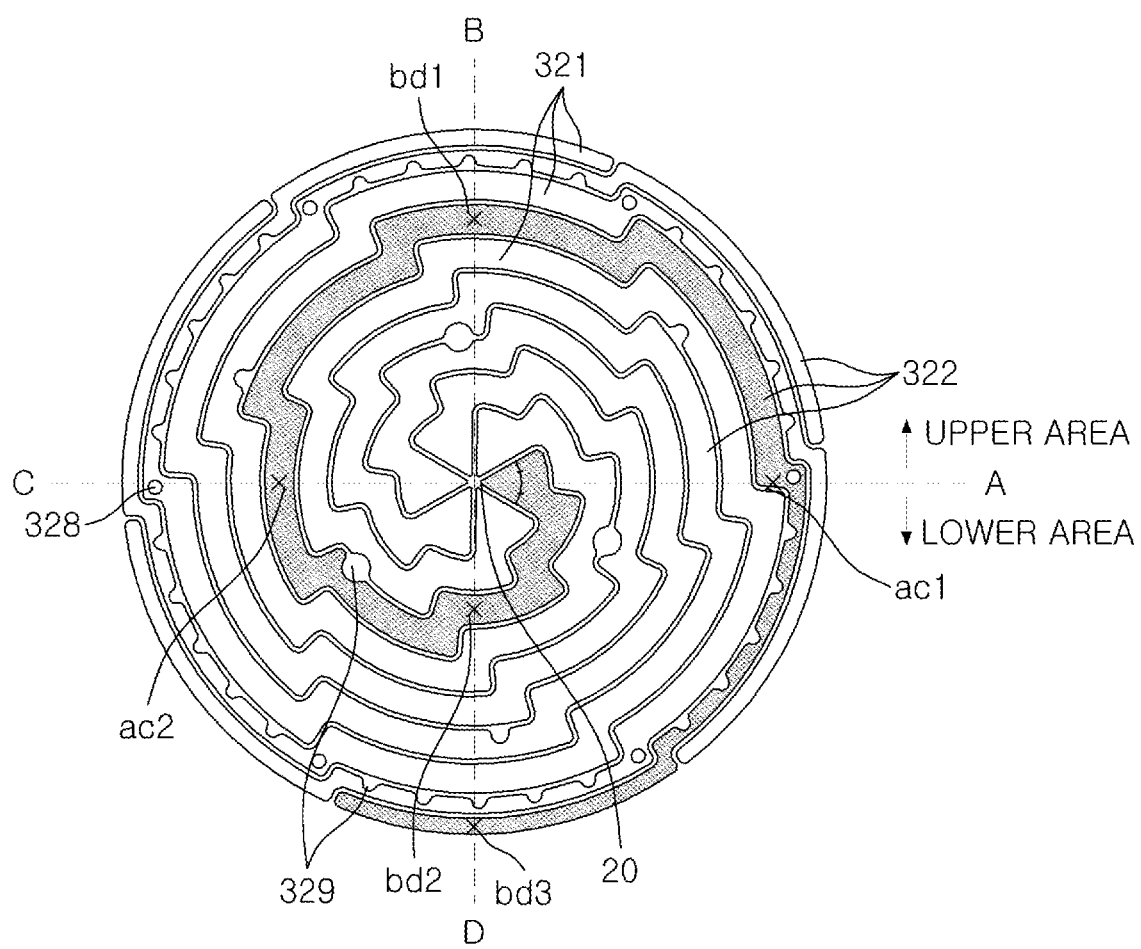
FIG. 6 is a diagram for describing an additional feature of an electrode pattern of an electro static chuck plate according to an exemplary embodiment of the present invention.

FIG. 6 is a diagram for describing an additional feature of an electrode pattern of an electro static chuck plate 300 according to an exemplary embodiment of the present invention.

As illustrated in FIG. 6, when there is an extension line AC (or corresponding to an extension line of a line segment passing through the center and the end point 20 of the electro static chuck plate 300) formed by extending the tangent when the tangent of the center line at the end point 20 of each of the electrodes 321 and 322 of the electro static chuck plate 300 meets the outer periphery of the plate, if the rotational angle of the spiral pattern of each of the electrodes 321 and 322 is formed at 360° or larger as described above, each of the electrodes 321 and 322 has two or more cross points (e.g., act and act in FIG. 6) passing through the extension line AC. Further, when assuming an extension line BD of a line segment orthogonal to the extension line AC, each of the electrodes 321 and 322 has two or more cross points (e.g., bd1, bd2, and bd3 in FIG. 6) passing through the BD.

Therefore, as illustrated in FIG. 6, the spiral pattern of each of the electrodes 321 and 322 includes four quadrants divided by two orthogonal line segments AC and BD passing through the center of the electro static chuck plate 300. Each quadrant is a first quadrant of interval A-B, a second quadrant of interval B-C, a third quadrant of interval C-D, and a fourth quadrant of interval D-A. Here, a deviation (a difference from an average) of a relative area ratio of an electrode which belongs to each quadrant is preferably equal to or less than 0.2 as shown in [Table 2]. Here, the relative area ratio may normalize an area of any one quadrant, e.g., the first quadrant to 1.00. [Table 2] below is a table in which values acquired by calculating the normalized area and the deviation of the electrode which belongs to each quadrant are organized according to the electrode pattern of FIG. 6.

TABLE 2

| Electrode location | | Electrode area | Area ratio deviation |
|---|---|---|---|
| First quadrant | A-B | 1.00 | 0.00 |
| Second quadrant | B-C | 0.82 | −0.18 |
| Third quadrant | C-D | 1.10 | 0.10 |
| Fourth quadrant | D-A | 1.08 | 0.08 |

In the present invention, a standard deviation of the normalized electrode area ratio of each quadrant is preferably equal to or less than 0.2. Hereinafter, this will be described with reference to FIGS. 7A and 7B.

Figure 7A:
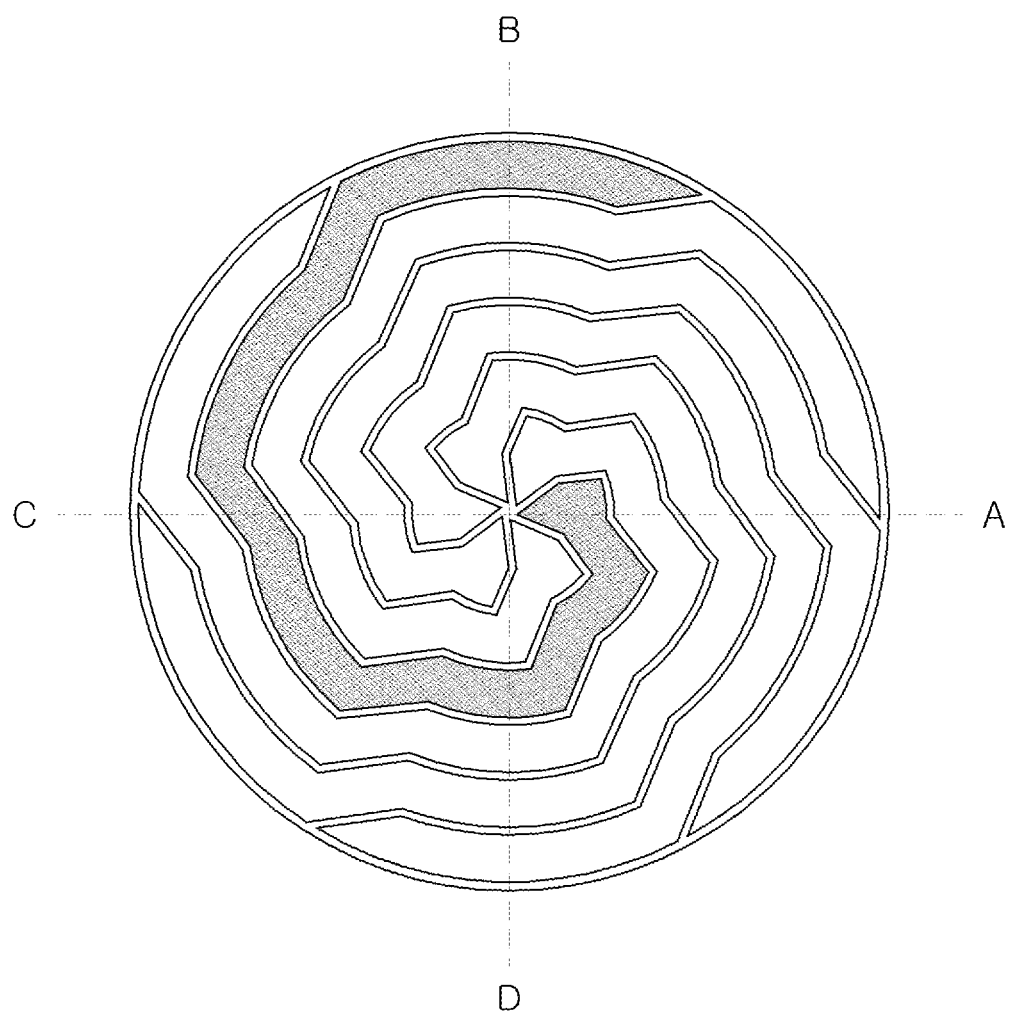
FIGS. 7A and 7B illustrate other examples of an electrode layer structure according to an exemplary embodiment of the present invention.
Figure 7B:
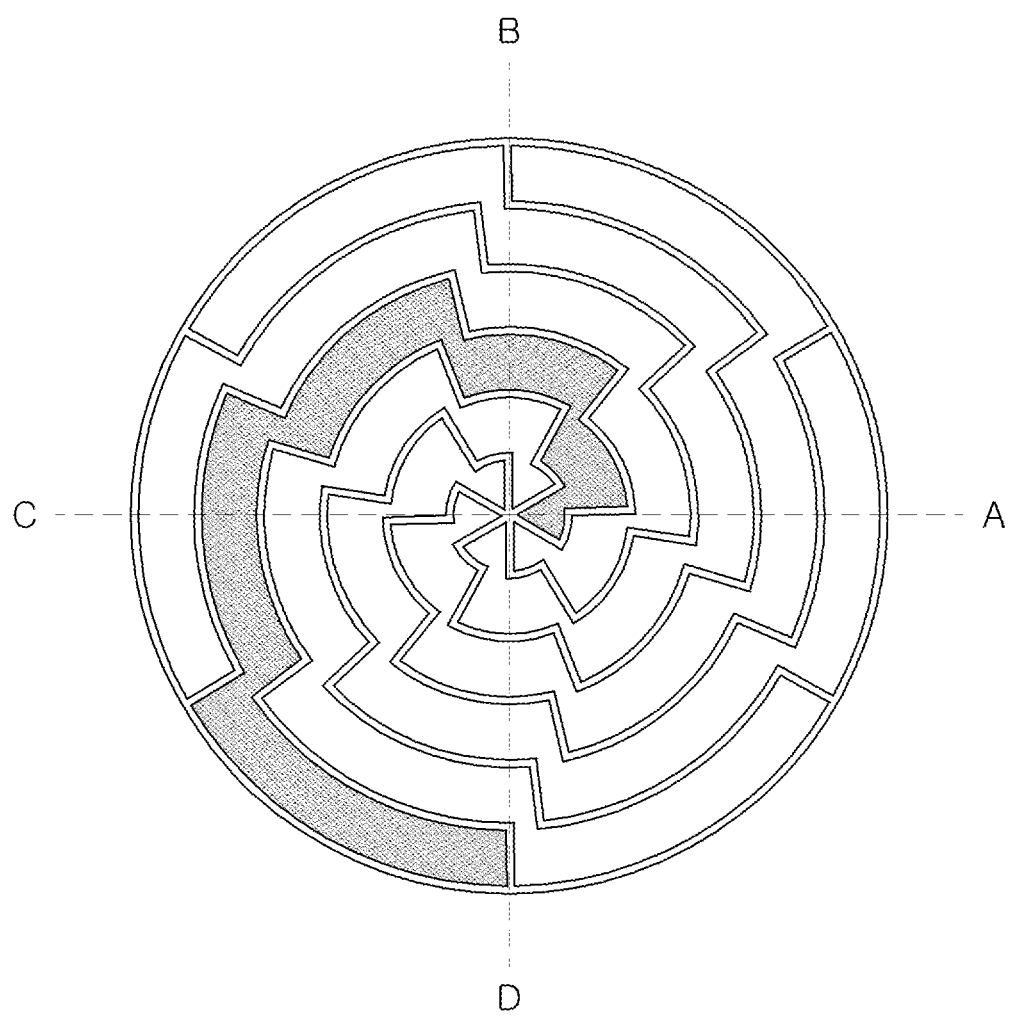

FIGS. 7A and 7B are diagrams illustrating an electrode pattern according to another exemplary embodiment of the present invention.

The case of FIG. 7A is a case where the standard deviation of the relative area ratio in each quadrant divided by two orthogonal line segments AC and BD is 0.54 and the case of FIG. 7B is an example of a case where the standard deviation of the relative area ratio in each quadrant divided by two orthogonal line segments AC and BD is 1.21. [Table 4] below shows the normalized area ratio and the area ratio standard deviation of each quadrant of the electrode pattern illustrated in FIGS. 6, 7A, and 7B.

TABLE 3

| | First quadrant | Second quadrant | Third quadrant | Fourth quadrant | Area ratio standard deviation |
|---|---|---|---|---|---|
| Exemplary embodiment (FIG. 6) | 1 | 0.82 | 1.10 | 1.08 | 0.12 |
| FIG. 7A | 1 | 2.19 | 1.54 | 1.09 | 0.54 |
| FIG. 7B | 1 | 2.09 | 2.81 | 0.04 | 1.21 |

In examples illustrated in FIGS. 7A and 7B, the electro static force and the discharge do not show a good result in a test of applying a bias of 5000 kV to the electrodes 321 and 322. In [Table 4] below, it is verified that the electro static force and the discharge are excellent when the deviation or the standard deviation of the relative area ratio of the fourth quadrant is 0.2 or less in a test of applying a DC bias of 5000 kV to one electrode 321 or 322.

TABLE 4

| Classification | Standard deviation | Electro force (gf/cm$^2$) | Evaluation result |
|---|---|---|---|
| Exemplary embodiment (FIG. 6) | 0.12 | 273 | Good |
| FIG. 7A | 0.54 | 162 | Bad |
| FIG. 7B | 1.21 | 100 | Bad |

Electrode arrangement based on the quadrant is described above, but the present invention may be expressed by another scheme, of course. For example, the spiral pattern may be divided into an upper region and a lower region based on the extension line AC and the electrode area of each region may be designed as illustrated in FIG. 6. When the spiral pattern of each of the electrodes 321 and 322 is divided into two upper and lower regions divided by the extension line AC, a relative area ratio difference of the area of the upper region and the area of the lower region is preferably 10% or less.

As described above, in the electro static chuck 100 according to the present invention, smooth chucking and dechucking can be achieved through an electrode structure in which a shape of an electrode and a form of an inter-electrode gap have optimum electro static and discharge performance for uniform chucking and dechucking regions. Further, stable dechucking may be provided in which chucking force of electro static adsorption is strengthened and a discharge time of an electric charge after a process is shortened by a multi-zone electrode structure (e.g., 6 zones) in which an area of an electrode is uniformly distributed over the entire region by minimizing the area of adjacent electrodes and maximally increasing a gap between the electrodes (360°n, e.g., an angle of a spiral electrode pattern of 360 to 760).

As described above, the present invention has been described by specified matters such as detailed components, and the like and limited exemplary embodiments and drawings, but the description is just provided to assist more overall understanding of the present invention and the present invention is not limited to the exemplary embodiment and various modifications and changes can be made by those skilled in the art from a scope without departing from an essential characteristic of the present invention. Accordingly, the spirit of the present invention should not be defined only by the described embodiments, and it should be appreciated that claims to be described below and all tech- nical spirit which is equivalent to the claims or equivalently modified are included in the claim of the present invention.

What is claimed is:

1. An electro static chuck comprising:
a base substrate; and
an electro static chuck plate fixed onto the base substrate and including a plurality of electrodes to which biases for chucking and dechucking are applied,
wherein each of the plurality of electrodes includes a spiral pattern extending from a start point of an edge of the electro static chuck plate toward an end point of a center and a rotational angle of the spiral pattern is 360° *n, n being a real number of 1 to 2, and
wherein the plurality of electrodes include a plurality of electrode patterns and a plurality of electrode gaps among the plurality of electrode patterns, and a length of a center line of the electrode gap is 1.1 to 5 times a length of a center line of the electrode pattern.

2. The electro static chuck of claim 1, wherein the plurality of electrodes are rotationally symmetric.

3. The electro static chuck of claim 1, wherein the plurality of electrodes include a plurality of first electrodes having a first polarity and a plurality of second electrodes having a second polarity, and
the plurality of first electrodes and the plurality of second electrodes are radially alternated.

4. The electro static chuck of claim 3, wherein a total number of the plurality of first electrodes and the plurality of second electrodes is even.

5. The electro static chuck of claim 3, wherein an area of each of the plurality of first electrodes and an area of each of the plurality of second electrodes are the same.

6. The electro static chuck of claim 1, wherein each of the plurality of electrodes has one or more bent parts between the start point and the end point of the electro static chuck plate.

7. The electro static chuck of claim 1, wherein each of the plurality of electrodes has a fluctuated contour between the start point and the end point of the electro static chuck plate.

8. The electro static chuck of claim 1, wherein the plurality of electrodes have one or more holes for a cooling gas hole between the start point and the end point of the electro static chuck plate.

9. The electro static chuck of claim 1, wherein the plurality of electrodes have a width narrowed part for a cooling gas hole between the start point and the end point of the electro static chuck plate.

10. The electro static chuck of claim 1,
wherein each of the plurality of electrodes has two or more cross points passing through a first extension line except the end point, the first extension line being formed by extending a tangent when the tangent of a center line of the spiral pattern at the end point meets an outer periphery of the electro static chuck plate, and
wherein the cross points are points where the center line of the spiral pattern of each of the plurality of the electrodes intersects the first extension line.

11. The electro static chuck of claim 10, wherein each of the plurality of electrodes has three or more cross points passing through a second extension line of a line segment orthogonal to the first extension line.

12. An electro static chuck comprising:
an insulating layer;
an electrode layer on the insulating layer; and
a dielectric layer on the electrode layer, wherein the electrode layer includes a plurality of electrodes for receiving biases for chucking and dechucking, and each of the plurality of electrodes includes a spiral pattern extending from a start point of an edge of the electrostatic chuck plate toward an end point of a center and a rotational angle is 360° *n, n being a real number of 1 to 2, and wherein the plurality of electrodes include a plurality of electrode patterns and a plurality of electrode gaps among the plurality of electrode patterns, and a length of a center line of the electrode gap is 1.1 to 5 times a length of a center line of the electrode pattern.

\* \* \* \* \*